United States Patent
Inamoto

(10) Patent No.: US 10,871,523 B2
(45) Date of Patent: Dec. 22, 2020

(54) BATTERY MONITORING APPARATUS

(71) Applicant: DENSO CORPORATION, Kariya (JP)

(72) Inventor: Takashi Inamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 108 days.

(21) Appl. No.: 16/297,210

(22) Filed: Mar. 8, 2019

(65) Prior Publication Data

US 2019/0277923 A1     Sep. 12, 2019

(30) Foreign Application Priority Data

Mar. 12, 2018   (JP) .................... 2018-044763

(51) Int. Cl.
   *G01R 31/396*     (2019.01)
   *G01R 31/364*     (2019.01)
   *H02J 7/00*     (2006.01)
   *G01R 31/3835*     (2019.01)
   *G01R 31/3828*     (2019.01)

(52) U.S. Cl.
CPC ......... *G01R 31/396* (2019.01); *G01R 31/364* (2019.01); *G01R 31/3828* (2019.01); *G01R 31/3835* (2019.01); *H02J 7/0019* (2013.01); *H02J 7/0021* (2013.01)

(58) Field of Classification Search
CPC ............... G01R 31/396; G01R 31/385; G01R 31/3828; G01R 31/364; H02J 7/0019; H02J 7/21
See application file for complete search history.

(56) References Cited

U.S. PATENT DOCUMENTS

| | | | | |
|---|---|---|---|---|
| 2008/0143298 A1* | 6/2008 | Yoshida | ................ | H02J 7/0026 320/136 |
| 2009/0085516 A1* | 4/2009 | Emori | ................ | B60L 3/0046 320/118 |
| 2009/0087722 A1* | 4/2009 | Sakabe | ................ | B60L 11/1879 429/61 |
| 2009/0198399 A1* | 8/2009 | Kubo | ................ | B60L 58/22 701/22 |
| 2012/0146652 A1* | 6/2012 | Aoki | ................ | G01R 31/396 324/433 |

(Continued)

*Primary Examiner* — Patrick Assouad
*Assistant Examiner* — Demetrius R Pretlow
(74) *Attorney, Agent, or Firm* — Oliff PLC

(57) ABSTRACT

A battery monitoring apparatus includes a first voltage detector provided to a first short circuit connected to a target cell, a second voltage detector connected to the target cell and provided to a second short circuit, a switch forming a closed circuit connected to an assembled battery and including a resistor, a third voltage detector detecting an inter-terminal voltage between positive and negative electrode terminals of the assembled battery, a switch abnormality determination section determining, in a state where the switch is driven in a closing direction, presence or absence of abnormal opening of the switch based on a difference between detection voltages obtained by the first and second voltage detectors, and a disconnection determination section determining, in the state where the switch is driven in the closing direction, presence or absence of disconnection at the assembled battery based on a detection voltage obtained by the third voltage detector.

5 Claims, 6 Drawing Sheets

(56) References Cited

U.S. PATENT DOCUMENTS

| | | | |
|---|---|---|---|
| 2013/0320986 A1* | 12/2013 | Shiraishi | G01R 31/327 |
| | | | 324/415 |
| 2014/0197841 A1* | 7/2014 | Mizoguchi | B60L 3/0046 |
| | | | 324/434 |
| 2017/0117596 A1 | 4/2017 | Kubo | |
| 2017/0279283 A1* | 9/2017 | Kim | H02J 7/0021 |
| 2018/0024196 A1* | 1/2018 | Imura | G01R 31/2607 |
| | | | 324/762.01 |
| 2018/0088178 A1* | 3/2018 | Inamoto | G01R 31/3835 |
| 2018/0188326 A1* | 7/2018 | Huh | G01R 19/16504 |
| 2019/0267815 A1* | 8/2019 | Hidaka | H01M 10/486 |

* cited by examiner

US 10,871,523 B2

BATTERY MONITORING APPARATUS

CROSS-REFERENCE TO RELATED APPLICATION

The present application is based on and claims the benefit of priority from earlier Japanese Patent Application No. 2018-44763 filed Mar. 12, 2018, the description of which is incorporated herein by reference.

BACKGROUND

Technical Field

The present invention relates to a battery monitoring apparatus configured to monitor an assembled battery configured by connecting a plurality of battery cells in series.

Related Art

JP 2017-78658 A discloses a battery monitoring apparatus in which a switch is, for determining abnormal disconnection of an assembled battery, provided on an electric path connected to positive and negative electrode terminals of the assembled battery. In the battery monitoring apparatus disclosed in JP 2017-78658 A, when the presence or absence of disconnection of the assembled battery is determined, the switch is closed to form a closed circuit connecting the positive and negative electrode terminals of the assembled battery. In this state, the presence or absence of disconnection of the assembled battery is determined based on the voltage of the closed circuit.

In JP 2017-78658 A, the presence or absence of disconnection of the assembled battery is determined on the assumption that no abnormality occurs in opening/closing of the switch. Thus, when abnormal opening occurs, i.e., the switch is constantly in an open state regardless of the state of an operation signal, there is a risk that the presence or absence of disconnection at the assembled battery is not accurately determined.

SUMMARY

An embodiment provides a battery monitoring apparatus configured so that the presence or absence of disconnection of an assembled battery can be properly determined.

As a first aspect of the embodiment, a battery monitoring apparatus is provided which monitors an assembled battery configured by connecting a plurality of battery cells in series. The apparatus includes: a first voltage detector provided to a first short circuit connected to positive and negative electrodes of a target cell, the target cell being at least any of a top cell of the plurality of battery cells and being connected to the battery monitoring apparatus and a bottom cell of the plurality of battery cells and being connected to the battery monitoring apparatus; a second voltage detector connected to the positive and negative electrodes of the target cell and provided to a second short circuit differing from the first short circuit in an electric path resistance value due to a resistor provided on an electric path; a switch forming a closed circuit connected to positive and negative electrode terminals of the assembled battery and including the resistor; a third voltage detector configured to detect, in the closed circuit, an inter-terminal voltage between the positive and negative electrode terminals of the assembled battery; a switch abnormality determination section configured to determine, in a state in which the switch is driven in a closing direction, presence or absence of abnormal opening of the switch based on a difference between a detection voltage obtained by the first voltage detector and a detection voltage obtained by the second voltage detector; and a disconnection determination section configured to determine, in the state in which the switch is driven in the closing direction, presence or absence of disconnection at the assembled battery based on a detection voltage obtained by the third voltage detector.

DETAILED DESCRIPTION OF THE PREFERRED EMBODIMENTS

First Embodiment

Hereinafter, a first embodiment in which a battery monitoring apparatus according to the present invention is embodied will be described with reference to the drawings. In the present embodiment, the battery monitoring apparatus is applied to a power supply system installed in a hybrid vehicle or an electric vehicle.

Figure 1:
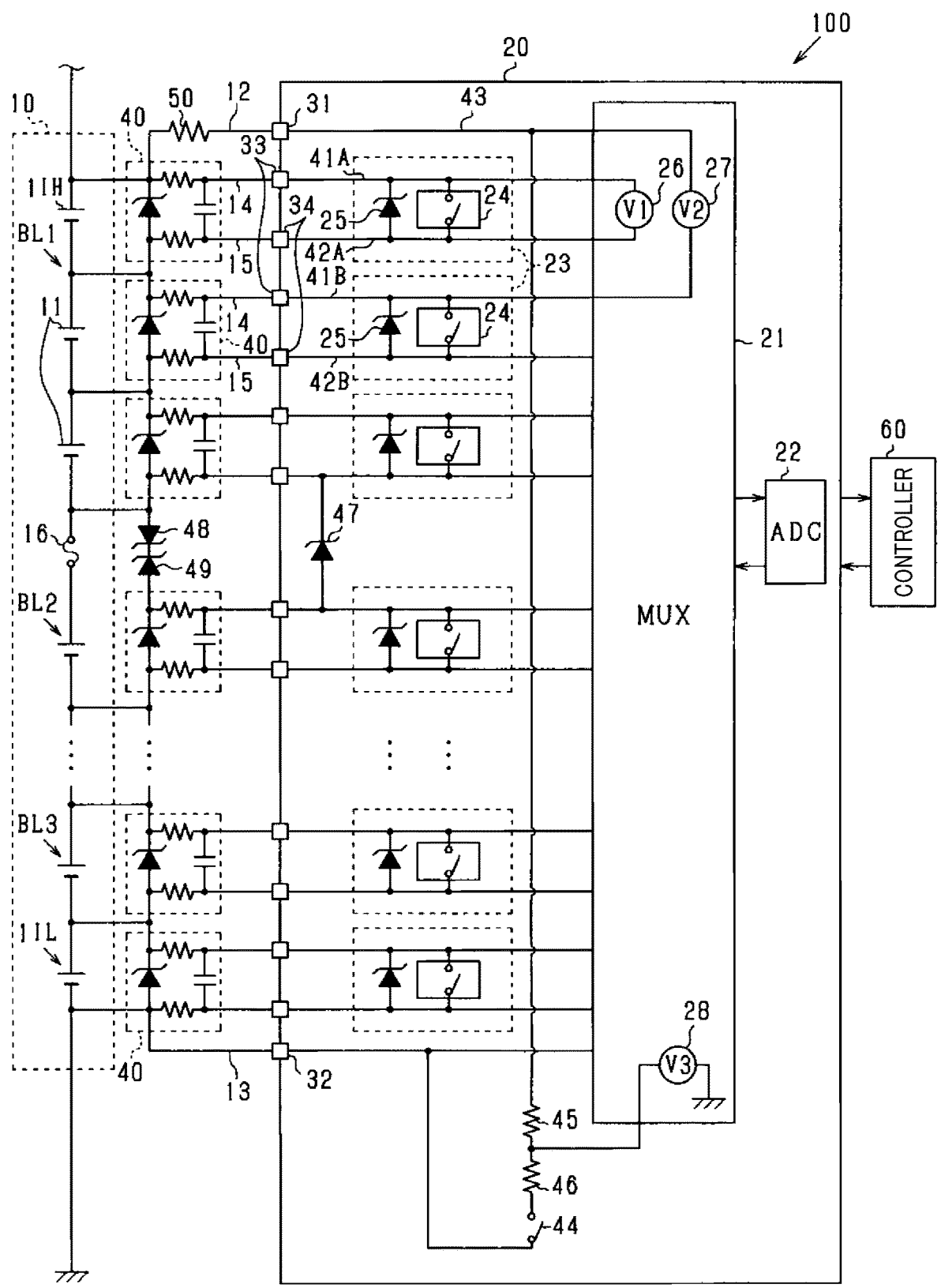
FIG. 1 is a configuration diagram of an assembled battery and a battery monitoring apparatus.

FIG. 1 illustrates a configuration diagram of an assembled battery 10 and a battery monitoring apparatus 100 of the present embodiment. The assembled battery 10 is configured by connecting a plurality of battery cells 11 in series. Note that each of the battery cells 11 of the present embodiment includes a lithium-ion secondary battery.

The assembled battery 10 is configured such that a plurality of blocks are connected in series, each of the blocks including multiple battery cells 11. In the configuration shown in FIG. 1, the assembled battery 10 has blocks BL1 to BL3, and these blocks BL1 to BL3 are connected to each other via a wire 16 serving as a connection member.

In the present embodiment, of the multiple battery cells 11 of the assembled battery 10, the top cell 11 connected to the battery monitoring apparatus 100 is a high-potential cell 11H, and the bottom cell 11 connected to the battery monitoring apparatus 100 is a low-potential cell 11L. In the present embodiment, a positive electrode of the high-potential cell 11H corresponds to a positive electrode terminal of the assembled battery 10, and a negative electrode of the low-potential cell 11L corresponds to a negative electrode terminal of the assembled battery 10.

The battery monitoring apparatus 100 includes a monitoring circuit 20 configured to monitor the assembled battery 10. The monitoring circuit 20 is connected to positive and negative electrode sides of each of the battery cells 11 forming the assembled battery 10. Specifically, each positive electrode side terminal 33 of the monitoring circuit 20 is connected to the positive electrode side of a corresponding one of the battery cells 11 via a positive electrode side line 14, and each negative electrode side terminal 34 of the monitoring circuit 20 is connected to the negative electrode side of a corresponding one of the battery cells 11 via a negative electrode side line 15. Moreover, a positive terminal 31 of the monitoring circuit 20 is connected to the positive electrode side of the high-potential cell 11H via a positive side line 12, and a negative terminal 32 of the monitoring circuit 20 is connected to the negative electrode side of the low-potential cell 11L via a negative side line 13.

The monitoring circuit 20 includes a multiplexer (MUX) 21, first electric paths 41, second electric paths 42, and an analog-digital converter 22 (ADC).

The MUX 21 is connected to the positive electrode side terminals 33 via the first electric paths 41, and is connected to the negative electrode side terminals 34 via the second electric paths 42. Thus, the MUX 21 can acquire, as a cell voltage, which is the voltage of each of the battery cells 11, a voltage difference between each of the first electric paths 41 and each of the second electric paths 42.

A third electric path 43, whose one end is connected to the positive terminal 31 and whose other end is connected to the negative terminal 32, is provided to the monitoring circuit 20. Voltage divided resistors 45, 46 and a determination switch 44 are provided to the third electric path 43. The determination switch 44 includes, for example, a voltage-driven semiconductor switching element. The determination switch 44 is closed such that the positive and negative electrode side terminals of the assembled battery 10 are connected to each other via the third electric path 43.

The monitoring circuit 20 includes balancing circuits 23 connected to the positive and negative electrode sides of the respective battery cells 11 and are configured to discharge the respective battery cells 11. In the present embodiment, the balancing circuit 23 includes a discharge switch 24 and a Zener diode 25. One end of the discharge switch 24 is connected to the first electric path 41, and the other end of the discharge switch 24 is connected to the second electric path 42. The discharge switch 24 is closed such that a closed circuit including the first electric path 41, the second electric path 42, the battery cell 11, and the discharge switch 24 is formed, and therefore, the battery cell 11 can be discharged. An anode of the Zener diode 25 is connected to the second electric path 42 and a cathode of the Zener diode 25 is connected to the first electric path 41, and therefore, the first electric path 41 and the second electric path 42 are connected to each other.

The MUX 21 includes a first voltage detector 26 connected to the positive and negative electrodes of the high-potential cell 11H, and a second voltage detector 27 connected to the positive and negative electrodes of the high-potential cell 11H via an electric path different from that of the first voltage detector 26.

One end of the first voltage detector 26 is connected to a first electric path 41A connected to the positive electrode side of the high-potential cell 11H, and the other end of the first voltage detector 26 is connected to a second electric path 42A connected to the negative electrode side of the high-potential cell 11H. Thus, the first voltage detector 26 detects, as a first detection voltage V1, the cell voltage of the high-potential cell 11H via the balancing circuit 23 connected to the positive and negative electrodes of the high-potential cell 11H. In the present embodiment, the balancing circuit 23 corresponds to a first short circuit.

One end of the second voltage detector 27 is connected to the third electric path 43 connected to the positive electrode side of the high-potential cell 11H, and the other end of the second voltage detector 27 is connected to a first electric path 41B connected to the negative electrode side of the high-potential cell 11H. Thus, the second voltage detector 27 detects, as a second detection voltage V2, the cell voltage of the high-potential cell 11H or a value obtained by subtracting a value corresponding to a voltage drop of a detection resistor 50 from the cell voltage of the high-potential cell 11H via the third electric path 43 and the first electric path 41B. In the present embodiment, a closed circuit including the detection resistor 50, the third electric path 43, and the first electric path 41B corresponds to a second short circuit.

The MUX 21 includes a third voltage detector 28 connected to a connection point between the voltage divided resistors 45 and 46. The third voltage detector 28 detects, as a third detection voltage V3, a value obtained by dividing an inter-terminal voltage of the assembled battery 10 generated between the positive terminal 31 and the negative terminal 32 by the voltage divided resistors 45 and 46.

The detection resistor 50 is provided to the positive side line 12. The resistance value of the detection resistor 50 is set so that an electric path resistance value in the second short circuit is higher than an electric path resistance value in the first short circuit.

The battery monitoring apparatus 100 includes protection circuits 40 each provided between the positive electrode side line 14 and the negative electrode side line 15. In the present embodiment, the protection circuit 40 includes a Zener diode connected in parallel with the battery cell 11, and a low-pass filter including a resistor and a bypass capacitor.

The monitoring circuit 20 includes Zener diodes 47 each connected in parallel with the wire 16 between adjacent ones of the blocks BL1 to BL3. In FIG. 1, only the Zener diode 47 connected in parallel with the wire 16 connecting the block BL1 and the block BL2 is illustrated. A cathode of the Zener diode 47 is connected to the second electric path 42 connected to a negative electrode side of the block BL1, and an anode of the Zener diode 47 is connected to the first electric path 41 connected to a positive electrode side of the block BL2. Note that the Zener diode 47 is also connected in parallel with the wire 16 connecting the block BL2 and the block BL3.

The monitoring circuit 20 includes Zener diodes 48 and 49 configured to reduce occurrence of an overvoltage due to the assembled battery 10 in a case where abnormal disconnection of the wire 16 has occurred.

The battery monitoring apparatus 100 includes a controller 60. The controller 60 is connected to the ADC 22 of the monitoring circuit 20 to acquire a voltage value outputted as a digital value from the ADC 22. The controller 60 is a microcomputer including a CPU, a ROM, a RAM, an I/O interface, and the like, and each function is implemented in such a manner that the CPU executes a program stored in the ROM.

The controller 60 performs, based on the charging rate (SOC: State of Charge) of each of the battery cells 11, balancing control for controlling the amount of discharge from each of the battery cells 11. In the balancing control, opening/closing driving for each of the discharge switches 24 is controlled so that the SOC is equalized among the battery cells 11, and therefore, the amount of discharge from each of the battery cells 11 is adjusted.

There are concerns about occurrence of abnormal disconnection of the assembled battery 10 due to forgetting assembling the wire 16 or disconnection of the wire 16, for example. For this reason, the controller 60 performs disconnection determination for determining the presence or absence of disconnection of the assembled battery 10.

In the disconnection determination performed by the controller 60, the determination switch 44 is driven in a closing direction on condition that no charge/discharge current is flowing in the assembled battery 10, and the third detection voltage V3 is detected by the third voltage detector 28. The determination switch 44 is closed such that a closed circuit (hereinafter referred to as an "assembled battery side closed circuit") including the assembled battery 10, the terminals 31, 32, and the third electric path 43 is formed, and current flows in this assembled battery side closed circuit. In a state in which the assembled battery side closed circuit is formed, if the wire 16 is not disconnected, the third detection voltage V3 is a value obtained by dividing the total of the cell voltages of all the battery cells 11 by the voltage divided resistors 45 and 46. On the other hand, if the wire 16 is disconnected, breakdown current flows in the Zener diode 47 connected in parallel with the wire 16, and a voltage drop occurs. Thus, the third detection voltage V3 in a case where the wire 16 is disconnected is a smaller value than the third detection voltage V3 in a case where no disconnection has occurred. The controller 60 can determine, based on the third detection voltage V3, the presence or absence of disconnection of the assembled battery 10.

In the disconnection determination performed by the controller 60, if abnormal opening has occurred at the determination switch 44, the closed circuit including the third electric path 43 is not formed, and therefore, there are concerns about inaccurate determination of the presence or absence of disconnection of the assembled battery 10. For this reason, in the present embodiment, the presence or absence of abnormal opening of the determination switch 44 is determined using the first and second detection voltages V1, V2 detected by the first voltage detector 26 and the second voltage detector 27.

Figure 2:
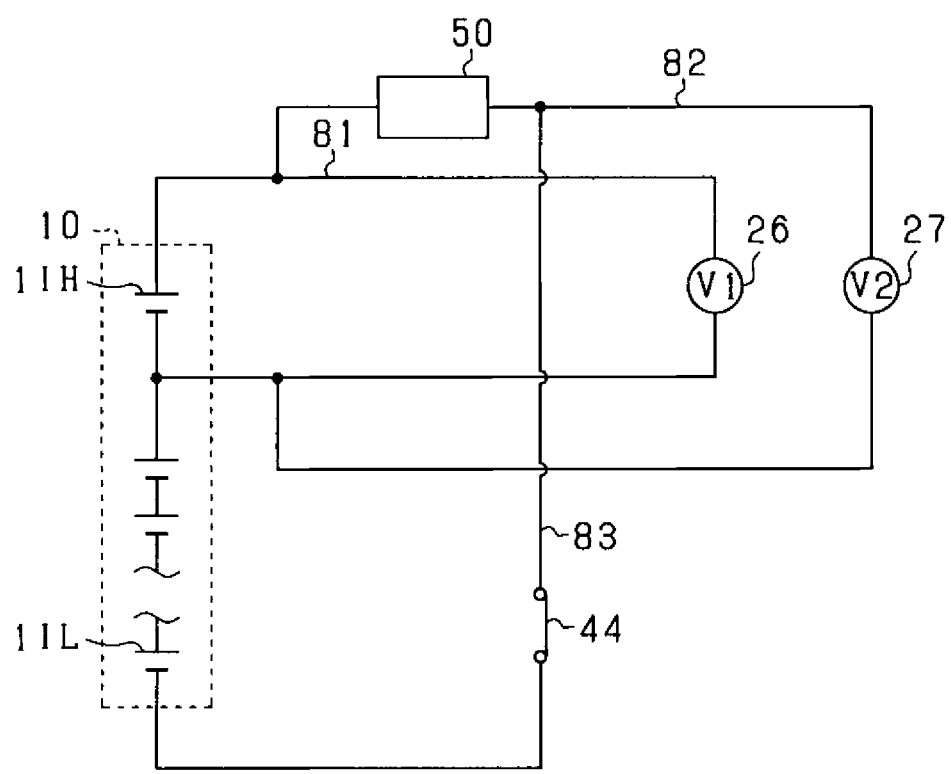
FIG. 2 is a diagram for illustrating the principle of abnormal opening determination for a determination switch.

Next, the principle of determining the presence or absence of abnormal opening of the determination switch 44 will be described with reference to FIG. 2. FIG. 2 illustrates a conduction state of the monitoring circuit 20 in a case where the determination switch 44 is in a closed state. A circuit provided with the first voltage detector 26 is illustrated as a first short circuit 81, and a circuit provided with the second voltage detector 27 is illustrated as a second short circuit 82.

In an open state of the determination switch 44, no current is flowing in the second short circuit 82 connected to the positive and negative electrodes of the high-potential cell 11H and including the detection resistor 50. Thus, the second voltage detector 27 detects the cell voltage of the high-potential cell 11H as the second detection voltage V2.

As illustrated in FIG. 2, the determination switch 44 is driven in the closing direction so that an assembled battery side closed circuit 83 connected to the positive and negative electrodes of the assembled battery 10 and including the detection resistor 50 in the path thereof is formed. The inter-terminal voltage of the assembled battery 10 is applied to the assembled battery side closed circuit 83, and therefore, current flows in the detection resistor 50. Thus, the second voltage detector 27 detects, as the second detection voltage V2, the value obtained by subtracting the value corresponding to the voltage drop of the detection resistor 50 from the cell voltage of the high-potential cell 11H. That is, if no abnormal opening has occurred at the determination switch 44, the determination switch 44 is driven in the closing direction so that the second detection voltage V2 is decreased by the value corresponding to the voltage drop of the detection resistor 50.

The value corresponding to the voltage drop of the detection resistor 50 can be calculated as a value obtained by subtracting the second detection voltage V2 detected by the second voltage detector 27 from the first detection voltage V1 detected by the first voltage detector 26. Thus, the controller 60 performs, based on a voltage difference between the first detection voltage V1 and the second detection voltage V2, abnormal opening determination for determining the presence or absence of abnormal opening of the determination switch 44.

Figure 3:
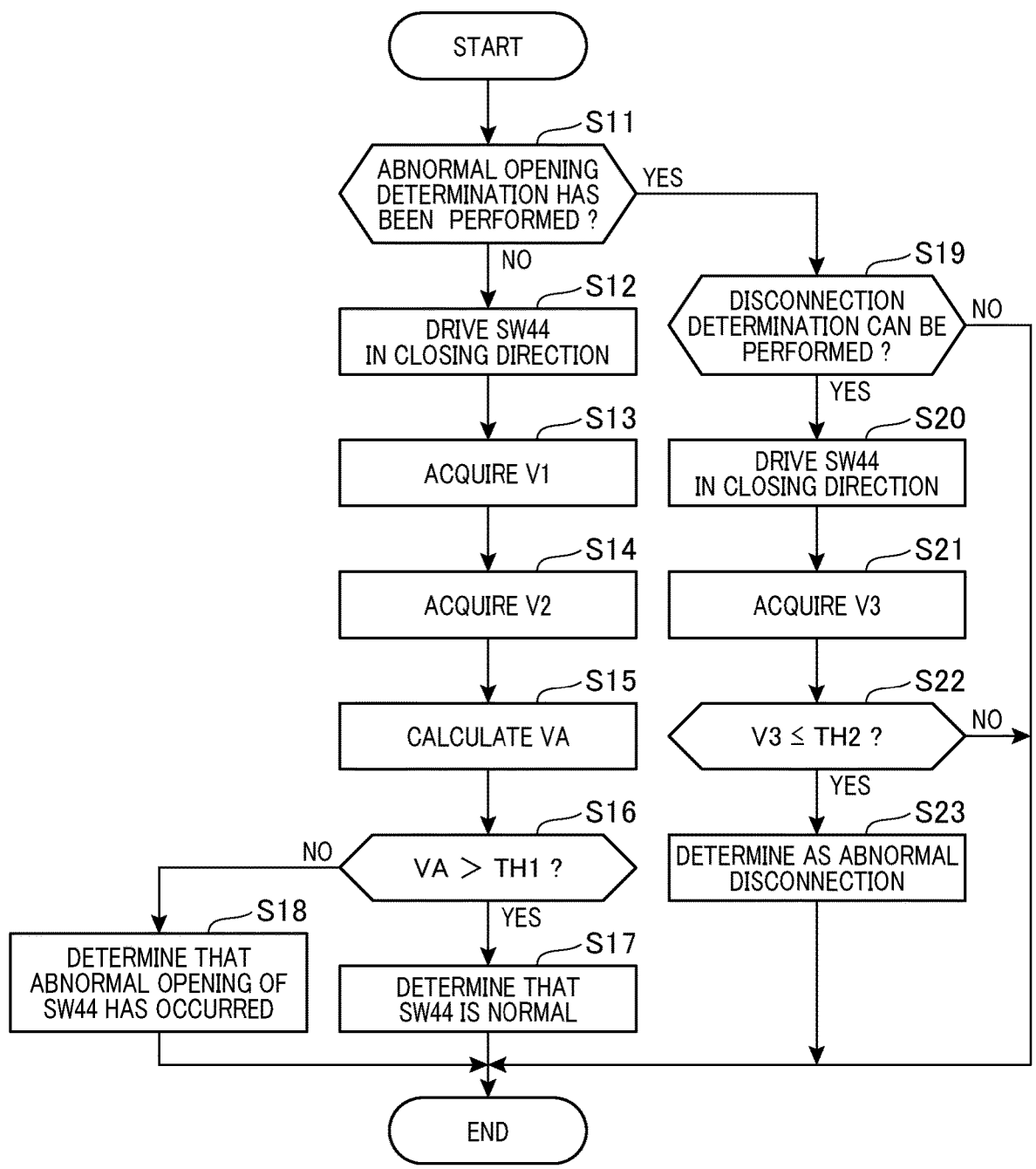
FIG. 3 is a flowchart of a procedure of disconnection determination and the abnormal opening determination.

Next, the procedure of the disconnection determination for the assembled battery 10 and the abnormal opening determination for the determination switch 44 performed by the controller 60 will be described with reference to FIG. 3. The processing illustrated in FIG. 3 is repeatedly performed in a predetermined cycle by the controller 60.

In step S11, it is determined whether the abnormal opening determination for the determination switch 44 has been performed or not. If the abnormal opening determination has been performed, the processing proceeds to step S19. In the present case, the processing proceeds to step S12, assuming that the abnormal opening determination has not been performed yet. In step S12, the determination switch 44 is driven in the closing direction.

In step S13, the first detection voltage V1 detected by the first voltage detector 26 is acquired. In step S14, the second detection voltage V2 detected by the second voltage detector 27 is acquired. In step S15, the value obtained by subtracting the second detection voltage V2 from the first detection voltage V1 is calculated as a voltage difference VA.

In step S16, it is determined whether the voltage difference VA calculated in step S15 is more than a first threshold TH1 or not. For example, the first threshold TH1 is set based on the value corresponding to the voltage drop of the detection resistor 50 in a case where the determination switch 44 is in an open state.

If it is determined that the voltage difference VA is more than the first threshold TH1, the processing proceeds to step S17. In a case where the processing proceeds to step S17, the voltage drop of the detection resistor 50 has occurred in association with driving of the determination switch 44 in the closing direction. Thus, in step S17, the determination switch 44 is determined as normal.

On the other hand, if it is determined that the voltage difference VA is equal to or less than the first threshold TH1, the processing proceeds to step S18. In a case where the processing proceeds to step S18, the determination switch 44 is not closed, and therefore, in step S18, it is determined that abnormal opening of the determination switch 44 has occurred.

When the processing of step S17 or step S18 is completed, the processing in FIG. 3 is temporarily terminated. Steps S11 to S18 correspond to a switch abnormality determination section.

Returning to step S11, the processing proceeds to step S19 if the abnormal opening determination has been performed. In step S19, it is determined whether the disconnection determination for the assembled battery 10 can be performed or not. In the present embodiment, in a case where it is, in step S17, determined that the determination switch 44 is normal, it is determined that the disconnection determination for the assembled battery 10 can be performed. On the other hand, in a case where it is not determined that the disconnection determination for the assembled battery 10 can be performed, the processing in FIG. 3 is temporarily terminated.

In step S20, the determination switch 44 is driven in the closing direction. In step S21, the third detection voltage V3 detected by the third voltage detector 28 is acquired.

In step S22, it is determined whether the third detection voltage V3 acquired in step S21 is equal to or less than a second threshold TH2 or not. The second threshold TH2 is, for example, set based on the voltage generated between the positive terminal 31 and the negative terminal 32 in a case where the wire 16 is disconnected.

If it is determined that the third detection voltage V3 is equal to or less than the second threshold TH2, the processing proceeds to step S23, and it is determined that abnormal disconnection of the assembled battery 10 has occurred. On the other hand, if it is determined that the third detection voltage V3 is more than the second threshold TH2, no abnormal disconnection of the assembled battery 10 has occurred, and therefore, the processing of FIG. 3 is temporarily terminated. Steps S19 to S23 correspond to a disconnection determination section.

In the present embodiment described above, the following advantageous effects are provided.

In addition to the disconnection determination for the assembled battery 10 based on the third detection voltage V3, the controller 60 performs the abnormal opening determination for the determination switch 44 based on the voltage difference VA between the first detection voltage V1 and the second detection voltage V2. Thus, the presence or absence of disconnection of the assembled battery 10 can be properly determined.

The controller 60 performs the disconnection determination for the assembled battery 10 on condition that it is determined that no abnormal opening of the determination switch 44 has occurred. In this case, in a case where abnormal opening of the determination switch 44 has determined, the presence or absence of disconnection at the assembled battery 10 is not determined. Thus, erroneous determination of disconnection of the assembled battery 10 due to influence of abnormal opening of the determination switch 44 can be avoided.

The balancing circuits 23 each configured to balance the voltage of the battery cell 11 are each connected between the positive and negative electrodes of the battery cell 11, and the first short circuit is the balancing circuit 23 provided between positive and negative electrodes of a target cell. In this case, the abnormal opening determination for the assembled battery 10 can be performed using the balancing circuits 23 provided to the respective battery cells 11 of the assembled battery 10.

Variations of First Embodiment

Instead of the high-potential cell 11H, the bottom low-potential cell 11L connected to the battery monitoring apparatus 100 may be used as the target cell used for the abnormal opening determination for the determination switch 44. In this case, the first voltage detector 26 may be provided to the first short circuit connected to the positive and negatives electrodes of the low-potential cell 11L. Moreover, the second voltage detector 27 may be provided to the second short circuit connected to the positive and negative electrodes of the low-potential cell 11L.

Second Embodiment

In the second embodiment, configurations different from those of the first embodiment will be mainly described. Note that the same reference numerals as those of the first embodiment are used to represent equivalent elements in the second embodiment, and description thereof will not be repeated.

In a case where leakage current is flowing in an electric path connecting positive and negative electrodes of the high-potential cell 11H and the first voltage detector 26, the first detection voltage V1 becomes smaller than that in a case where no leakage current is flowing due to a voltage drop caused by the leakage current. As a result, even when the determination switch 44 is closed, a voltage difference between the first detection voltage V1 and a second detection voltage V2 becomes small, and there is a probability that the presence or absence of abnormal opening of the determination switch 44 is erroneously determined. For this reason, in the present embodiment, the controller 60 performs leakage determination for determining whether the leakage current is flowing in the electric path connecting the positive and negative electrodes of the high-potential cell 11H and the first voltage detector 26 or not. In a case where it is determined that the leakage current is flowing, the controller 60 does not perform the disconnection determination.

The electric path for which the presence or absence of leakage is determined by the leakage determination may be an electric path connected to the positive and negative electrodes of the high-potential cell 11H and forming the first short circuit. In the present embodiment, the balancing circuit 23 connected to the high-potential cell 11H is targeted for the leakage determination.

Figure 4:
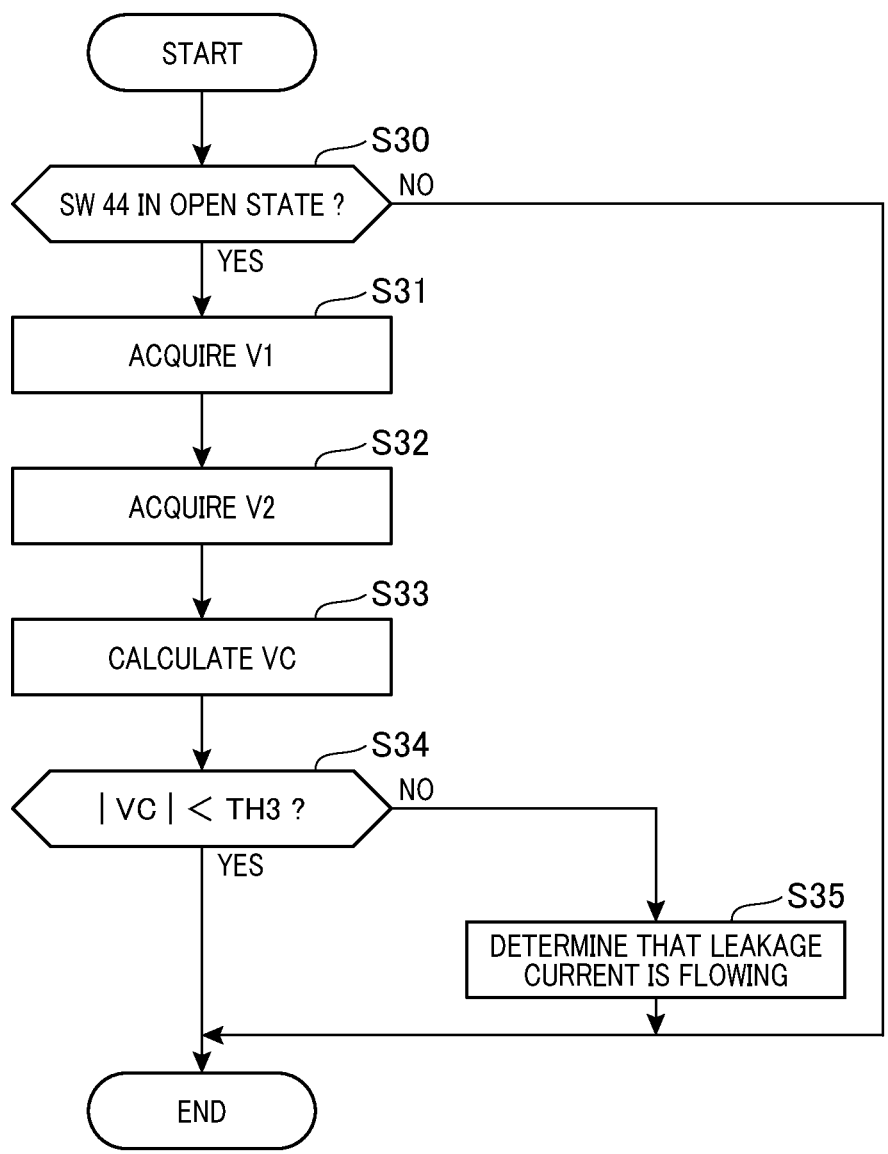
FIG. 4 is a flowchart of a procedure of leakage determination according to a second embodiment.

The procedure of the leakage determination performed by the controller 60 will be described with reference to FIG. 4. The processing illustrated in FIG. 4 is repeatedly performed in a predetermined cycle by the controller 60.

In step S30, it is determined whether the determination switch 44 is in an open state or not, and the processing proceeds to step S31 in a case where it is determined that the determination switch 44 is in an open state. Note that when the determination switch 44 is not in an open state, the processing in FIG. 4 is temporarily terminated. In step S31, the first detection voltage V1 detected by the first voltage detector 26 is acquired. In step S32, the second detection voltage V2 detected by the second voltage detector 27 is acquired.

In step S33, a voltage difference VC between the first detection voltage V1 acquired in step S31 and the second detection voltage V2 acquired in step S32 is calculated.

In step S34, an absolute value of the voltage difference VC calculated in step S33 is compared with a third threshold TH3. In the present embodiment, the third threshold TH3 is a value set for determining whether the leakage current is flowing in the balancing circuit 23 connected to the high-potential cell 11H or not. If it is determined that the absolute value of the voltage difference VC is a value smaller than the third threshold TH3, no leakage has occurred, and therefore, the processing in FIG. 4 is temporarily terminated. On the other hand, if it is determined that the absolute value of the voltage difference VC is equal to or more than the third threshold TH3, the processing proceeds to step S35.

In step S35, it is determined that the leakage current is flowing in the balancing circuit 23 connected to the positive and negative electrodes of the high-potential cell 11H. In the present embodiment, in step S19 of FIG. 3, one of conditions for determination that disconnection determination for an assembled battery 10 can be performed is that no leakage current is flowing. Thus, in a case where the processing proceeds to step S19 in FIG. 3, if it is, in step S35, determined that the leakage current is flowing, it is determined that the disconnection determination cannot be performed, and the disconnection determination is not performed. Steps S30 to S35 correspond to a leakage current determination section.

In the present embodiment described above, the controller 60 determines the presence or absence of disconnection at the assembled battery 10 on condition that it is determined that no leakage current is flowing in the balancing circuit 23. In this case, improper determination of the presence or absence of disconnection of the assembled battery due to the leakage current flowing in the balancing circuit 23 can be prevented.

Third Embodiment

In the third embodiment, configurations different from those of the first embodiment will be mainly described. Note that the same reference numerals as those of the first embodiment are used to represent equivalent elements in the third embodiment, and description thereof will not be repeated.

For example, in a case where there is variation in the cell voltage among the battery cells 11 and the balancing control is not properly performed, the cell voltage of the high-potential cell 11H might be higher or lower than the cell voltages of other battery cells 11. In such a case, there is a probability that abnormal opening is erroneously determined in abnormal opening determination for a determination switch 44. For this reason, in the present embodiment, the controller 60 performs the abnormal opening determination by means of the low-potential cell 11L in addition to the high-potential cell 11H.

Figure 5:
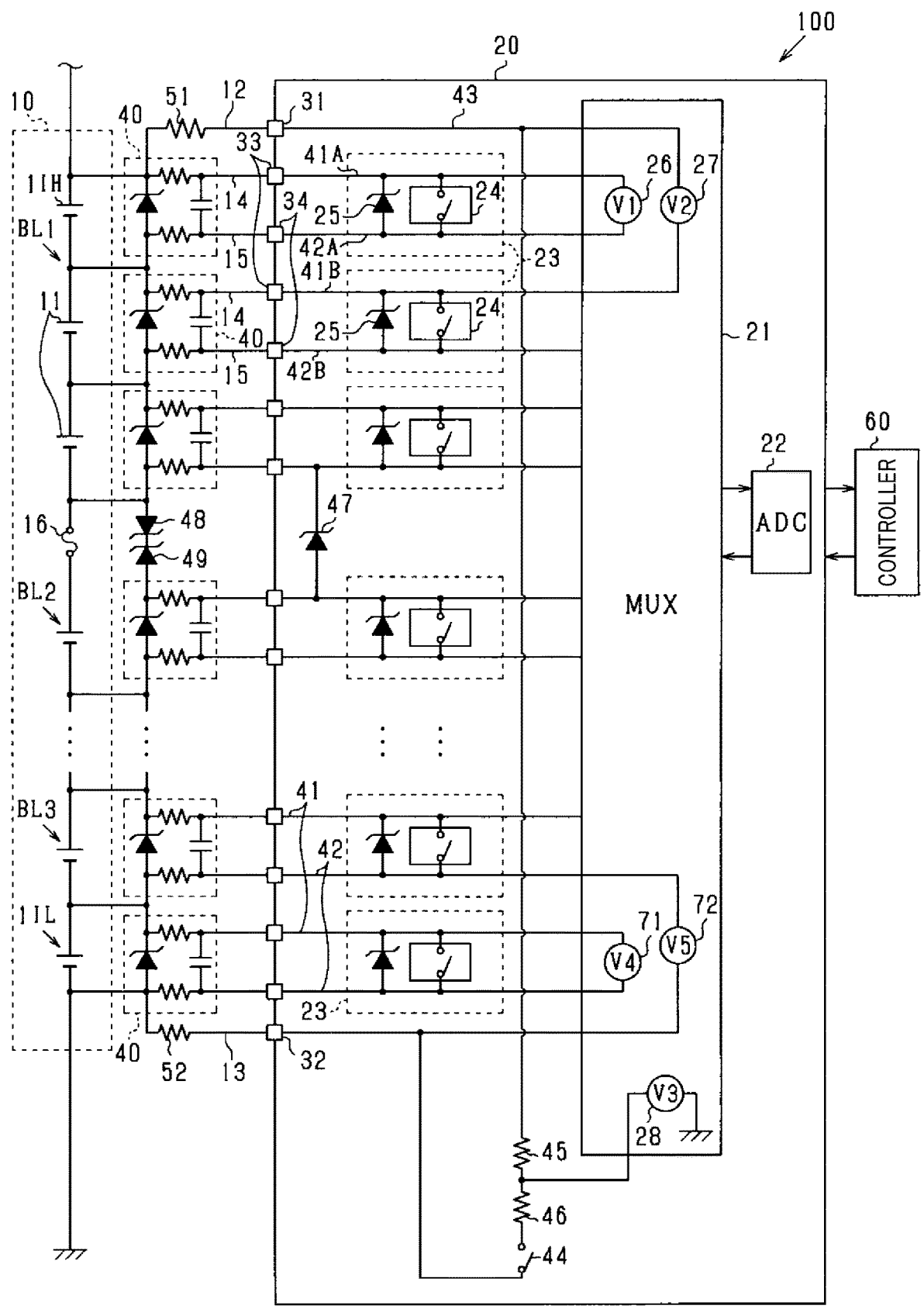
FIG. 5 is a configuration diagram of an assembled battery and a battery monitoring apparatus according to a third embodiment.

FIG. 5 is a configuration diagram of the assembled battery 10 and the battery monitoring apparatus 100 according to the third embodiment. In the present embodiment, the battery monitoring apparatus 100 includes, as detection resistors, a first detection resistor 51 provided in series to part of the positive side line 12, and a second detection resistor 52 provided in series to part of the negative side line 13.

In the present embodiment, the MUX 21 includes a first voltage detector 71 connected to positive and negative electrodes of the low-potential cell 11L, and a second voltage detector 72 connected to the positive and negative electrodes of the low-potential cell 11L via an electric path different from that of the first voltage detector 71.

One end of the first voltage detector 71 is connected to the first electric path 41 connected to the positive electrode of the low-potential cell 11L, and the other end of the first voltage detector 71 is connected to the second electric path 42 connected to the negative electrode of the low-potential cell 11L. Thus, the first voltage detector 71 detects, as a fourth detection voltage V4, the cell voltage of the low-potential cell 11L via the balancing circuit 23 connected to the positive and negative electrodes of the low-potential cell 11L.

One end of the second voltage detector 72 is connected to the second electric path 42 connected to the positive electrode of the low-potential cell 11L, and the other end of the second voltage detector 72 is connected to the third electric path 43 connected to the negative electrode of the low-potential cell 11L. Thus, the second voltage detector 72 detects, as a fifth detection voltage V5, the cell voltage of the low-potential cell 11L or a value obtained by subtracting a value corresponding to a voltage drop of the second detection resistor 52 from the cell voltage of the low-potential cell 11L, via the second electric path 42 and the third electric path 43.

Figure 6:
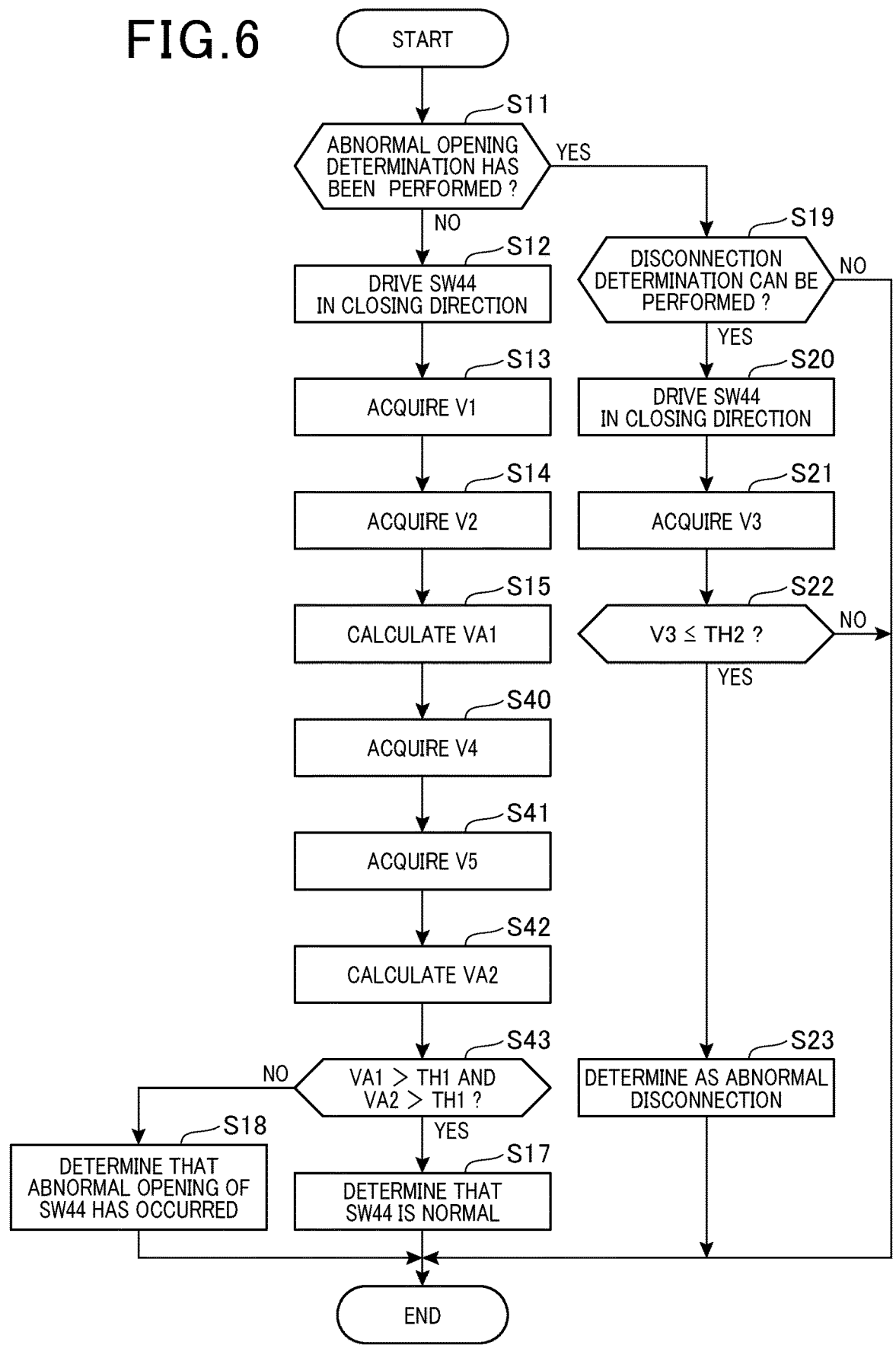
FIG. 6 is a flowchart of a procedure of disconnection determination and abnormal opening determination.

FIG. 6 is a flowchart for describing the procedure of disconnection determination for the assembled battery 10 and the abnormal opening determination for the determination switch 44 according to the third embodiment.

In step S15, when a voltage difference between the first detection voltage V1 and the second detection voltage V2 is calculated as a first voltage difference VA1, the processing proceeds to step S40. In step S40, the fourth detection voltage V4 detected by the first voltage detector 71 is acquired. In step S41, the fifth detection voltage V5 detected by the second voltage detector 72 is acquired.

In step S42, a voltage difference between the fourth detection voltage V4 and the fifth detection voltage V5 is calculated as a second voltage difference VA2.

In step S43, the presence or absence of abnormal opening of the determination switch 44 is determined using the first voltage difference VA1 calculated in step S15 and the second voltage difference VA2 calculated in step S42. In the present embodiment, if it is determined that the first and second voltage differences VA1 and VA2 are both more than the first threshold TH1, the processing proceeds to step S17, and it is determined that the determination switch 44 is normal. On the other hand, if at least any of the first and second voltage differences VA1 and VA2 is equal to or less than the first threshold TH1, the processing proceeds to step S18, and abnormal opening of the determination switch 44 is determined.

In step S43, a difference between the first voltage difference VA1 and the second voltage difference VA2 may be calculated, and the presence or absence of abnormal opening of the determination switch 44 may be determined from the difference. In this case, if it is determined that the difference between the first voltage difference VA1 and the second voltage difference V2 is less than a predetermined value, the processing proceeds to step S17, and it is determined that the determination switch 44 is normal. If it is determined that the difference is more than the predetermined value, the processing proceeds to step S18, and abnormal opening of the determination switch 44 is determined.

In the present embodiment described above, the following advantageous effects are provided. The controller 60 performs the abnormal opening determination for the determination switch 44 by means of both of the high-potential cell 11H and the low-potential cell 11L. In this case, the accuracy of determination of the presence or absence of abnormal opening of the determination switch 44 can be enhanced compared to the case of performing the abnormal opening determination for the determination switch 44 by means of one of the battery cells 11.

Other Embodiments

Instead of the configuration in which the single battery monitoring apparatus 100 is connected to the assembled battery 10, a set of two or more battery monitoring apparatuses 100 may be connected to a set of multiple cells forming the assembled battery 10. In this case, each of the battery monitoring apparatuses 100 may perform the abnormal opening determination and the disconnection determination according to the present embodiments for each of the cells of the connected assembled battery 10.

The first short circuit connected to the first voltage detector 26 may be a circuit connected to the positive and negative electrodes of the high-potential cell 11H, and does not necessarily include the balancing circuit 23. In this case, the first voltage detector 26 may be, for example, connected to the protection circuit 40 connected to the positive and negative electrodes of the high-potential cell 11H.

In the above-described embodiments, the disconnection determination for the assembled battery 10 is performed on condition that no abnormal opening of the determination switch 44 has occurred, but such a condition may be changed. For example, the disconnection determination for the assembled battery 10 may be performed regardless of the presence or absence of abnormal opening of the determination switch 44, and the result of the disconnection determination may be invalidated in a case where abnormal opening of the determination switch 44 is determined.

Instead of the lithium-ion secondary battery, a nickel-metal-hydride secondary battery may be used as the assembled battery 10.

Abnormal disconnection of the assembled battery 10 is not limited to forgotten assembly or disconnection of the wire 16, but may be abnormal disconnection in association with forgotten assembly or disconnection of a bus bar connecting the battery cells 11.

Hereinafter, aspects of the above-described embodiments will be summarized.

The embodiments relate to a battery monitoring apparatus (100) configured to monitor an assembled battery (10) configured by connecting a plurality of battery cells (11) in series.

As a first aspect of the embodiment, the battery monitoring apparatus includes a first voltage detector (26) provided to a first short circuit connected to positive and negative electrodes of a target cell, the target cell being at least any of a top cell (11H) of the plurality of battery cells and being connected to the battery monitoring apparatus and a bottom cell (11L) of the plurality of battery cells and being connected to the battery monitoring apparatus; a second voltage detector (27) connected to the positive and negative electrodes of the target cell and provided to a second short circuit differing from the first short circuit in an electric path resistance value due to a resistor (50) provided on an electric path; a switch (44) forming a closed circuit connected to positive and negative electrode terminals of the assembled battery and including the resistor; a third voltage detector (28) configured to detect, in the closed circuit, an inter-terminal voltage between the positive and negative electrode terminals of the assembled battery; a switch abnormality determination section (60) configured to determine, in a state in which the switch is driven in a closing direction, presence or absence of abnormal opening of the switch based on a difference between a detection voltage obtained by the first voltage detector and a detection voltage obtained by the second voltage detector; and a disconnection determination section (60) configured to determine, in the state in which the switch is driven in the closing direction, presence or absence of disconnection at the assembled battery based on a detection voltage obtained by the third voltage detector.

According to the above-described configuration, the switch is driven in the closing direction, and in this manner, the closed circuit connected to the positive and negative electrode terminals of the assembled battery is formed. In this case, a voltage applied from the assembled battery to the closed circuit is different between a case where no disconnection has occurred at the assembled battery and a case where disconnection has occurred at the assembled battery. Thus, the inter-terminal voltage between the positive and negative electrode terminals of the assembled battery is detected in the closed circuit so that the presence or absence of disconnection of the assembled battery can be determined. Note that if abnormal opening has occurred at the switch forming the closed circuit, there are concerns about inaccurate determination of abnormal disconnection of the assembled battery.

On this point, in the above-described configuration, at least any of one of the plurality of battery cells of the assembled battery closest to a positive electrode terminal side and one of the plurality of battery cells of the assembled battery closest to a negative electrode terminal side is taken as the target cell, the first short circuit is connected to the positive and negative electrodes of the target cell, and the first voltage detector is provided to the first short circuit. Moreover, the second short circuit is connected to the positive and negative electrodes of the target cell, and in the second short circuit, the resistor is provided on an electric path so that an electric path resistance value is different from that of the first short circuit. Further, the second voltage detector is provided to the second short circuit. In this case, when the switch is closed normally in the state in which the switch is driven in the closing direction, a voltage drop due to the resistor occurs on a second short circuit side. Thus, the voltage difference between the detection voltage of the first voltage detector and the detection voltage of the second voltage detector in the state in which the switch is driven in the closing direction is different between a state in which the switch is closed normally and a state in which abnormal opening of the switch has occurred, and based on the voltage difference, it can be determined whether abnormal opening of the switch has occurred or not.

As described above, in addition to disconnection determination for the assembled battery based on the inter-terminal voltage of the assembled battery, abnormal opening determination for the switch based on the difference between the detection voltage obtained by the first voltage detector and the detection voltage obtained by the second voltage detector is performed, and therefore, the presence or absence of disconnection of the assembled battery can be properly determined.

As a second aspect of the embodiment, the disconnection determination section determines the presence or absence of disconnection at the assembled battery on condition that the switch abnormality determination section determines that no abnormal opening of the switch has occurred.

In this case, in a case where it is determined that abnormal opening of the switch has occurred, the presence or absence of disconnection at the assembled battery is not determined. Thus, erroneous determination of disconnection of the assembled battery due to influence of abnormal opening of the switch can be avoided.

As a third aspect of the embodiment, balancing circuits (23) configured to balance voltages of the respective battery cells are connected between positive and negative electrodes of the respective battery cells, and the first short circuit is the balancing circuit provided between the positive and negative electrodes of the target cell.

In this case, the disconnection determination for the assembled battery can be performed using the balancing circuits provided to the respective battery cells of the assembled battery.

As a fourth aspect of the embodiment, the battery monitoring apparatus further includes a leakage current determination section configured to determine whether leakage current is flowing between the positive and negative electrodes of the target cell in the first short circuit or not, and the disconnection determination section determines the presence or absence of disconnection at the assembled battery on condition that the leakage current determination section determines that no leakage current is flowing.

It is assumed that in the first short circuit, leakage current flows between the positive and negative electrodes. In this case, a first detection voltage detected by the first voltage detector changes, and therefore, there is a probability that abnormal opening of the switch is not properly determined. As a result, there are concerns about an adverse effect on determination of the presence or absence of disconnection at the assembled battery. On this point, in the above-described configuration, the presence or absence of disconnection at the assembled battery is determined on condition that it is determined that no leakage current is flowing between the positive and negative electrodes of the target cell in the first short circuit. In this case, improper determination of the presence or absence of disconnection of the assembled battery due to the leakage current flowing in the first short circuit can be prevented.

As a fifth aspect of the embodiment, the top cell, which is of the plurality of battery cells and is connected to the battery monitoring apparatus, is a high-potential cell as the target cell, and the bottom cell, which is of the plurality of battery cells and is connected to the battery monitoring apparatus, is a low-potential cell as the target cell; and the switch abnormality determination section acquires, as a first voltage difference, a difference between the detection voltage obtained by the first voltage detector and the detection voltage obtained by the second voltage detector at the high-potential cell in the state in which the switch is driven in the closing direction, acquires, as a second voltage difference, a difference between the detection voltage obtained by the first voltage detector and the detection voltage obtained by the second voltage detector at the low-potential cell in the state in which the switch is driven in the closing direction, and determines, based on the first and second voltage differences, whether abnormal opening of the switch has occurred or not.

In this case, the presence or absence of abnormal opening of the switch is determined using two target cells on positive- and negative sides. Thus, the accuracy of determination of the presence or absence of abnormal opening can be enhanced compared to a case where the presence or absence of abnormal opening is determined using one of the target cells on the positive- and negative sides.

What is claimed is:

1. A battery monitoring apparatus for monitoring an assembled battery configured by connecting a plurality of battery cells in series, the apparatus comprising:
   a first voltage detector provided to a first short circuit connected to positive and negative electrodes of a target cell, the target cell being at least any of a top cell of the plurality of battery cells and being connected to the battery monitoring apparatus and a bottom cell of the plurality of battery cells and being connected to the battery monitoring apparatus;
   a second voltage detector connected to the positive and negative electrodes of the target cell and provided to a second short circuit differing from the first short circuit in an electric path resistance value due to a resistor provided on an electric path;
   a switch forming a closed circuit connected to positive and negative electrode terminals of the assembled battery and including the resistor;
   a third voltage detector configured to detect, in the closed circuit, an inter-terminal voltage between the positive and negative electrode terminals of the assembled battery;
   a switch abnormality determination section configured to determine, in a state in which the switch is driven in a closing direction, presence or absence of abnormal opening of the switch based on a difference between a detection voltage obtained by the first voltage detector and a detection voltage obtained by the second voltage detector; and
   a disconnection determination section configured to determine, in the state in which the switch is driven in the closing direction, presence or absence of disconnection at the assembled battery based on a detection voltage obtained by the third voltage detector.

2. The battery monitoring apparatus according to claim 1, wherein
   the disconnection determination section determines the presence or absence of disconnection at the assembled battery on condition that the switch abnormality determination section determines that no abnormal opening of the switch has occurred.

3. The battery monitoring apparatus according to claim 1, wherein
   balancing circuits configured to balance voltages of the respective battery cells are connected between positive and negative electrodes of the respective battery cells, and
   the first short circuit is the balancing circuit provided between the positive and negative electrodes of the target cell.

4. The battery monitoring apparatus according to claim 1, further comprising a leakage current determination section configured to determine whether leakage current is flowing between the positive and negative electrodes of the target cell in the first short circuit or not, wherein
   the disconnection determination section determines the presence or absence of disconnection at the assembled battery on condition that the leakage current determination section determines that no leakage current is flowing.

5. The battery monitoring apparatus according to claim 1, wherein
   the top cell, which is included in the plurality of battery cells and is connected to the battery monitoring apparatus, is a high-potential cell as the target cell, and the bottom cell, which is included in the plurality of battery cells and is connected to the battery monitoring apparatus, is a low-potential cell as the target cell, and
   the switch abnormality determination section
   acquires, as a first voltage difference, a difference between the detection voltage obtained by the first voltage detector and the detection voltage obtained by the second voltage detector at the high-potential cell in the state in which the switch is driven in the closing direction,
   acquires, as a second voltage difference, a difference between the detection voltage obtained by the first voltage detector and the detection voltage obtained by the second voltage detector at the low-potential cell in the state in which the switch is driven in the closing direction, and
   determines, based on the first and second voltage differences, whether abnormal opening of the switch has occurred or not.

* * * * *